United States Patent [19]

Brandstetter

[11] Patent Number: 4,922,256
[45] Date of Patent: May 1, 1990

[54] TRACKING RECEIVER FOR BROADBAND CHIRP EMISSIONS

[75] Inventor: Robert W. Brandstetter, Levittown, N.Y.

[73] Assignee: Grumman Aerospace Corporation, Bethpage, N.Y.

[21] Appl. No.: 273,465

[22] Filed: Nov. 18, 1988

[51] Int. Cl.⁵ .............................................. G01S 13/66
[52] U.S. Cl. .................................... 342/132; 342/190; 342/192; 342/196; 364/485; 364/516; 367/88
[58] Field of Search ............... 342/52, 54, 74, 75, 342/77, 132, 351, 25, 78, 192, 201, 426, 458; 364/822, 485, 516, 517; 356/5; 367/38, 40, 42, 64, 88, 100-102

[56] References Cited
U.S. PATENT DOCUMENTS

| | | | |
|---|---|---|---|
| 3,088,113 | 4/1963 | Rosenthal | 364/822 X |
| 3,220,003 | 11/1965 | Montague, III et al. | 342/132 |
| 3,426,207 | 2/1969 | Fried et al. | 455/611 |
| 3,430,240 | 2/1969 | Loesch | 342/201 |
| 3,560,973 | 2/1971 | Kazel | 342/458 |
| 3,571,597 | 3/1971 | Wood et al. | 455/607 |
| 3,618,095 | 11/1971 | Darlington | 342/201 |
| 3,647,298 | 3/1972 | Soules | 356/5 |
| 3,842,420 | 10/1974 | Rabow | 342/426 |
| 3,859,658 | 1/1975 | Rabow | 342/78 |
| 3,992,708 | 11/1976 | Olson et al. | 342/52 X |
| 4,016,563 | 4/1977 | Pedinoff | 342/192 |
| 4,050,070 | 9/1977 | Beno et al. | 342/187 |
| 4,204,262 | 5/1980 | Fitelson et al. | 364/822 |
| 4,325,065 | 4/1982 | Caputi, Jr. | 342/25 |
| 4,634,230 | 1/1987 | Spezio | 342/54 X |
| 4,805,158 | 2/1989 | Fogarty | 364/882 X |

OTHER PUBLICATIONS

R. Graf, "Dictionary of Electronics", p. 94; Howard W. Sams & Co., Indianapolis; 1974; Fourth Edition.
Proceedings of the IRE, vol. 50 #6, Jun. 1962, pp. 1544-1546.

Primary Examiner—Thomas H. Tarcza
Assistant Examiner—Bernarr Earl Gregory
Attorney, Agent, or Firm—Scully, Scott, Murphy & Presser

[57] ABSTRACT

A tracking receiver is disclosed which utilizes optical processing for detecting and tracking input broadband chirp like emission signals. The tracking receiver includes a scanning local oscillator, the output signal of which is caused to be scanned in frequency. A mixer mixes the unknown input signal and the local oscillator output signal to produce an intermediate frequency (IF), frequency difference signal. The IF signal is analyzed in an optical spectrum analyzer which includes an acoustooptical modulator for modulating a beam of radiation, as a laser beam, with the intermediate frequency signal, and optical means, as a lens, for producing a spatial frequency distribution of the intermediate frequency spectrum in a Fourier plane. A photodetector array is provided in the Fourier plane for detecting the spatial spectrum. A processor processes the output of the photodetector for temporally stable grouped intensity patterns caused by an input spectra signal varying in frequency near the scan rate of the local oscillator. The processor is responsive thereto to control a programmer which controls the frequency of the local oscillator to cause it to approach and become equal to the frequency of the input spectra signal. A recorder is provided for recording the output of the scanning local oscillator, and the scanning local oscillator is controlled to proceed through a programmed frequency scan pattern.

6 Claims, 3 Drawing Sheets

TRACKING OPTICAL RECEIVER
FOR BROADBAND CHIRP
EMITTER INTERCEPT

TRACKING OPTICAL RECEIVER
BLOCK DIAGRAM

TRACKING OPTICAL RECEIVER
FOR BROADBAND CHIRP
EMITTER INTERCEPT

FREQUENCY TRACKING
& ERROR FUNCTION

TRACKING RECEIVER FOR BROADBAND CHIRP EMISSIONS

BACKGROUND OF THE INVENTION

Field of the Invention

The present invention relates generally to a tracking receiver which uses optical processing for detecting and tracking broadband chirp type emissions of unknown slope and bandwidth characteristics.

More particularly, the subject invention pertains to a tracking receiver as described which generates magnitude and directional information on the chirp emission for feedback controls from spatial frequency coordinates.

The present invention allows a broadband chirp type emission of unknown frequency slope and bandwidth characteristics to be detected and tracked. A chirp is a form of spread spectrum signal which generally exhibits very low spectral power density and, therefore, without the aid of a matched filter, it is extremely difficult to detect and track. This detection-tracking problem is compounded and made even more difficult when the chirp is of extremely broad bandwidth.

Based upon experience with airborne chirp radars, it has been observed that the detection process can be seriously hampered by high level interference, even for a comparatively narrow bandwidth chirp signal. This is due to the low spectral power density of a chirp signal. With a broad bandwidth chirp-like emission, the detection process is further complicated, particularly since the spectral power density generally decreases with increasing signal bandwidth.

SUMMARY OF THE INVENTION

Accordingly, it is a primary object of the present invention to provide a tracking receiver which uses an optical receiver, particularly a spectrum analyzer, to permit the detection and tracking of a unknown chirp emission.

A further object of the subject invention is the provision of a tracking receiver which provides a unique system for generating magnitude and directional information for feedback controls from spatial frequency coordinates.

The characteristics of a chirp signal (linear or nonlinear) normally require a matched filter or correlator for optimal detection, and the present invention provides a unique correlator implementation by a combination of a scanning local oscillator and an optical spectrum analyzer. In summary, the chirp is detected by the spectral signal pattern on a photodetector array where grouped intensities indicate that the local oscillator is nearing acquisition of the chirp. A single point $f_0$ readout indicates when the receiver is tracking the signal. Moreover, the tracking receiver and the use of a scanning local oscillator permits operation in any frequency band.

In accordance with the teachings herein, the present invention provides a tracking receiver for detecting and tracking broadband chirp type emissions of unknown slope and bandwidth characteristics. Moreover, the tracking receiver generates magnitude and directional information on the chirp emission for feedback controls from spatial frequency coordinates.

In accordance with a preferred embodiment, a tracking receiver is disclosed for detecting and tracking an input broadband chirp-like emission signal. Pursuant to the teachings herein, a scanning local oscillator produces a local oscillator output signal, which is caused to be scanned in frequency. A mixer mixes the input signal and the local oscillator output signal to produce an intermediate frequency (IF), frequency difference signal. The IF signal is analyzed in an optical spectrum analyzer which includes an Acousto-Optical Modulator (AOM) for modulating a beam of radiation, as a laser beam, with the intermediate frequency signal, and optical means, as a lens, for producing a spatial frequency distribution of the intermediate frequency spectrum in a Fourier plane. A photodetector is provided for detecting the spatial frequency distribution of the intermediate frequency spectrum in the Fourier plane. A processor processes the output of the photodetector for temporally stable grouped intensity patterns caused by an input spectra signal varying in frequency near the scan rate of the local oscillator. The processor is responsive thereto to control the frequency of the local oscillator to cause the sum of its frequency and the intermediate frequency signal to approach and become equal to the frequency of the input spectra signal, such that the frequency of the local oscillator tracks the frequency of the input spectra signal, and can be recorded. In greater particularity, a recorder is also provided for recording the output of the scanning local oscillator, and the scanning local oscillator is controlled to proceed through a programmed frequency scan pattern. Moreover, the photodetector preferably comprises a photodetector array positioned to detect radiation in the Fourier plane.

BRIEF DESCRIPTION OF THE DRAWINGS

The foregoing objects and advantages of the present invention for a tracking receiver for broadband chirp emissions may be more readily understood by one skilled in the art with reference being had to the following detailed description of several preferred embodiments thereof, taken in conjunction with the accompanying drawings wherein like elements are designated by identical reference numerals throughout the several views, and in which.

DETAILED DESCRIPTION OF THE DRAWINGS

Figure 1:
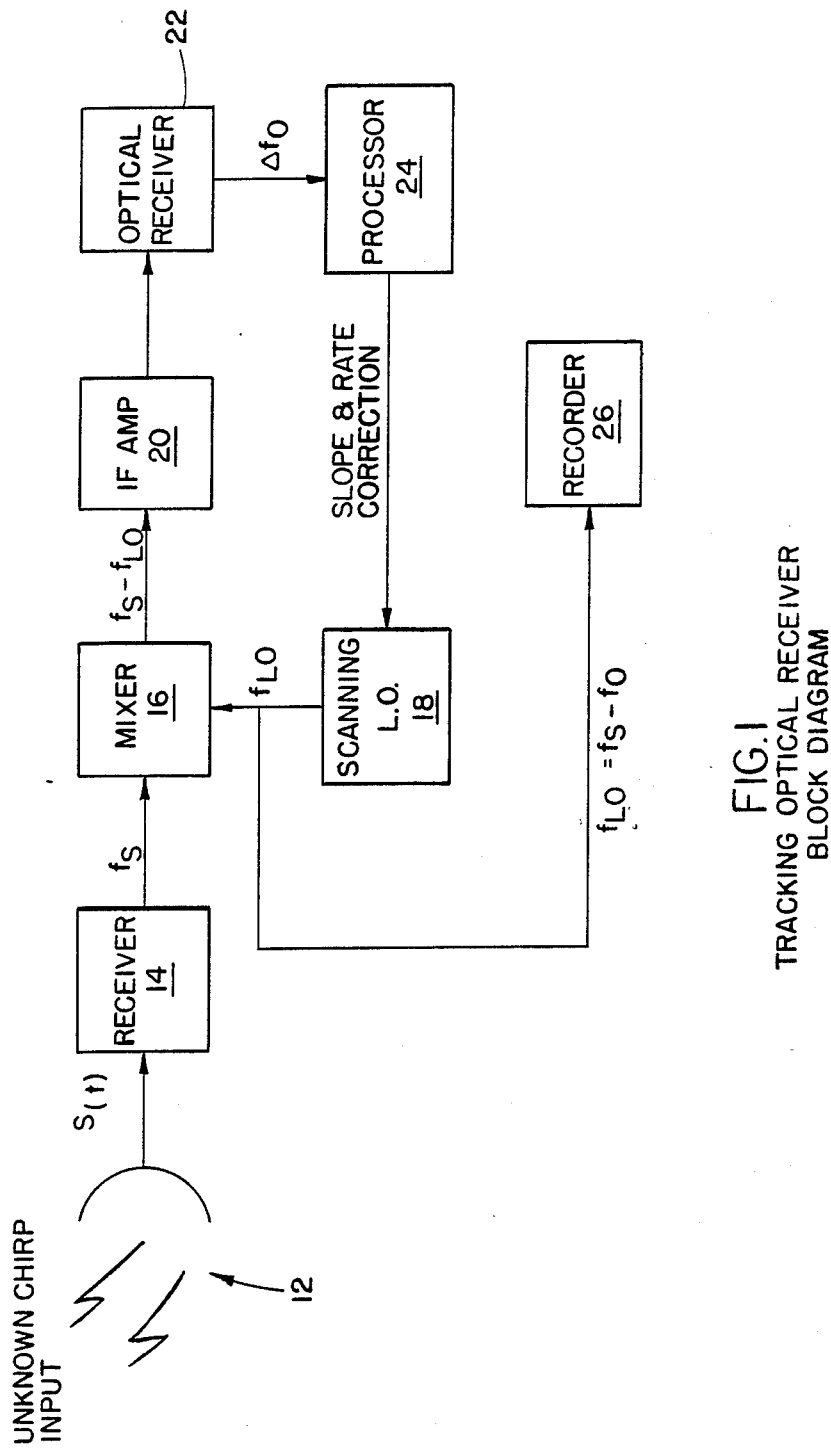
FIG. 1 illustrates a functional block diagram of a tracking receiver constructed pursuant to the teachings of the present invention which is designed for broadband chirp emission detection and tracking.

Referring to the drawings in detail, FIG. 1 illustrates a functional block diagram of a tracking receiver constructed pursuant to the teachings of the present invention. The tracking receiver receives as an input a broadband chirp type of emission of unknown slope and bandwidth characteristics S(t) which is to be detected and tracked. The chirp is initially processed by a receiver 14, the output of which is summed in a square law mixer 16 with the output of a scanning local oscillator 18. This produces sum and difference frequencies which are then passed through an Intermediate Frequency (IF) amplifier 20 which amplifies the difference frequency signal and directs it to an optical receiver 22. The optical receiver 22 essentially examines the spectrum of the intermediate frequency (IF) output for temporally stable frequency terms. These stable terms are outputted as a $\Delta f_o$ deviation from $f_o$, the IF center frequency. A processor 24 receives the $\Delta f_o$ signal, and provides output slope and rate correction terms which are used to control the scanning local oscillator (LO) 18. The scanning and mixing then proceeds, and the loop continues to track until $\Delta f_o = 0$. The frequency of the local oscillator is then related to the instantaneous frequency of the unknown chirp, with a fixed frequency difference equal to the IF, which at tracking is equal to $f_o$. Therefore, the output of the scanning local oscillator can be recorded at 26 as S(t) shifted in frequency.

Figure 2:
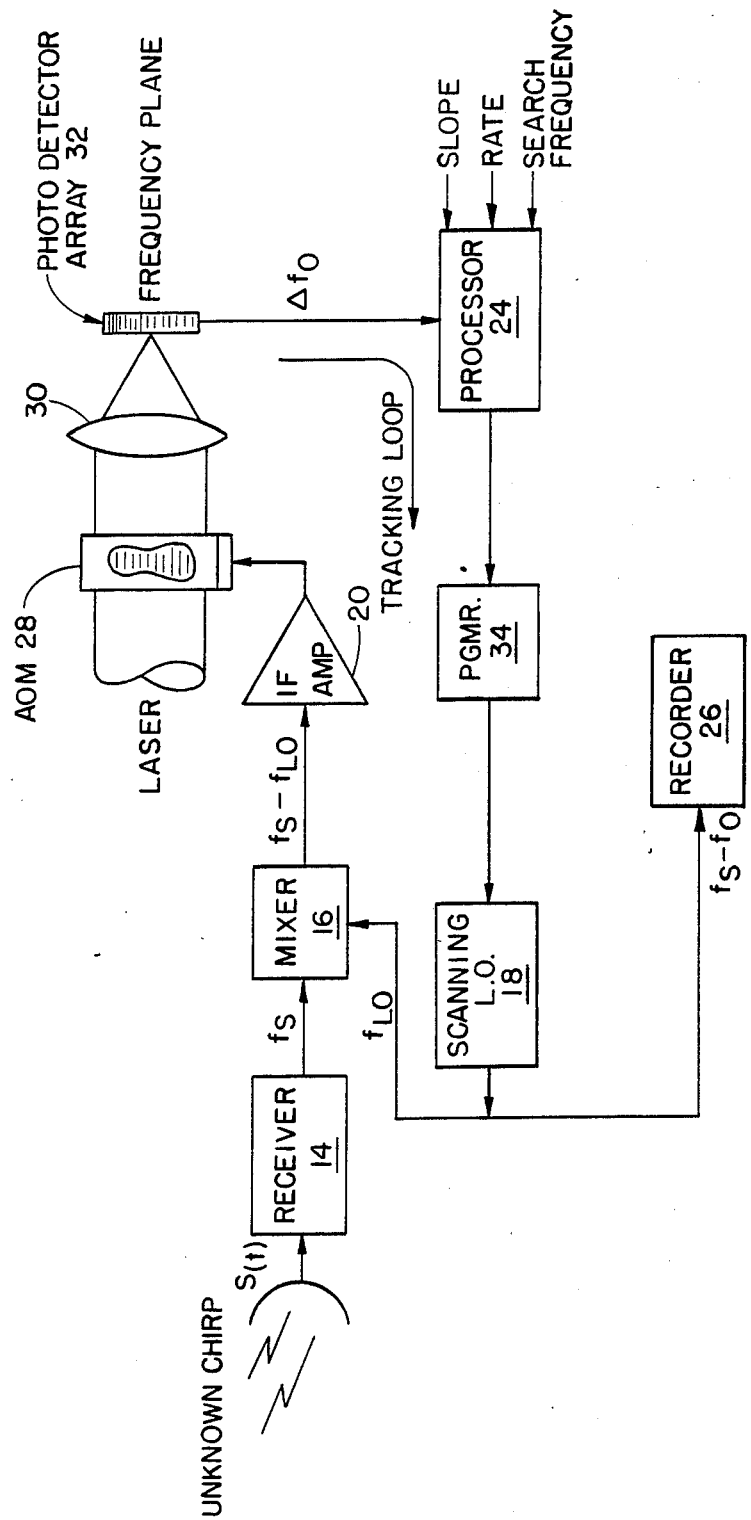
FIG. 2 is a more detailed functional block diagram of a tracking receiver pursuant to the subject invention.

FIG. 2 illustrates a more detailed diagram of an tracking receiver pursuant to the present invention. An output chirp signal S(t) is summed with the output signal of a digitally controlled scanning local oscillator 18 in a square law mixer 16, producing an an IF signal $f_s - f_{LO}$ which is within the IF bandwidth (BW). The IF signal is then directed to an optical cueing receiver in which an Acousto-Optic Modulator (AOM) impresses the IF modulation onto a laser carrier which is then optically Fourier transformed, as by a lens 30. This produces a spatial frequency distribution of the IF spectrum in the Fourier plane of the lens where it is detected by a photodetector array 32. The sum of the frequencies of the local oscillator and the IF are equal to the frequency of the chirp signal S(t), and the frequency component at the center of the photodetector array 32 corresponds to $f_o$, the center frequency of the IF stage. When there is a deviation from $f_o$, for example of $\Delta f_o$, a tracking error is generated in the loop. It is necessary to establish initialization conditions for $f_o$ detection and tracking. Accordingly, the processor 24 receives initialization inputs to enable it to establish initial tracking parameters to cause the tracking receiver to scan and look for given types of chirp emissions. These initialization inputs include an initial search frequency, and frequency slope and rate terms.

The search frequency is an initial search frequency for the scanning local oscillator, the slope is either positive or negative and indicates the direction (either up or down) of the change the in the frequency of the local oscillator, and the rate is a programmed time rate of change of the frequency of the scanning local oscillator (df/dt). This information is utilized by the processor to control the programmer 34, which directs a digital input signal to the scanning local oscillator 18, causing it to scan, looking for chirp signals.

Figure 3:
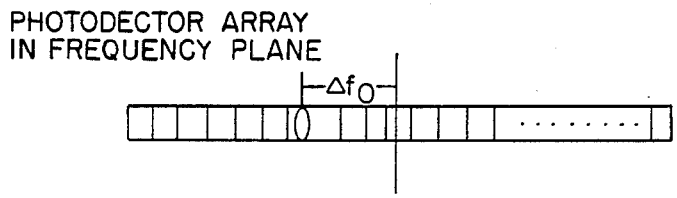
FIG. 3 illustrates an exemplary photodetector array in the Fourier plane.

Referring to FIG. 3, the photodetector array 32 is shown with some arbitrary $\Delta f_o$, meaning that at that instant the loop is tracking behind by $\Delta f_o$, which is detected as follows. As the local oscillator proceeds through a programmed frequency scan pattern, it produces a variety of spectra on the photodetector array 32. Only those spectra which are varying near the local oscillator scan rate will appear as grouped intensity patterns, while other signals will traverse the entire photodetector array 32 resulting in a low level output. Where intensified sectors appear on the photodetector array 32, the programmer 34 directs the local oscillator 18 to change its frequency, thus causing the scanning local oscillator 18 to increase or decrease in frequency in a direction to cause $\Delta f_o \rightarrow 0$. Ideally, when the loop is functioning properly and $\Delta f_o = 0$, the spectrum on the photodetector array 32 will correspond to a dominant single point which is the IF center frequency $f_o$. If the input signal S(t) changes, the loop responds by tracking the signal S(t).

Figure 4:
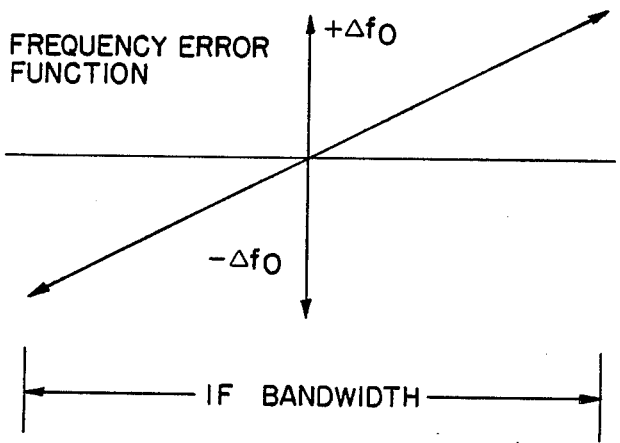
FIG. 4 is a graph of the frequency error function across the intermediate frequency bandwidth.

FIG. 4 illustrates the frequency error function across the intermediate frequency bandwidth, wherein the abscissa corresponds to the IF bandwidth and the ordinate is the error function $\Delta f_o$.

Figure 5:
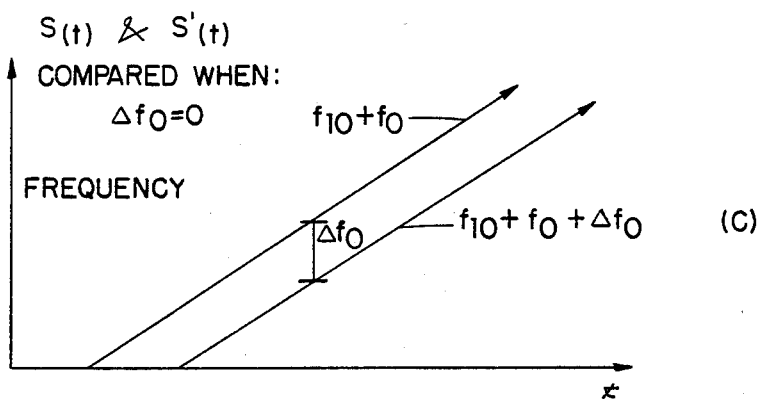
FIG. 5 illustrates graphs of the frequency tracking and error functions.

FIG. 5 illustrates graphs of the frequency tracking and error functions, and in particular FIG. 5 shows the case where the local oscillator rate of change of frequency df/dt is about equal to that of the signal S(t), but with a tracking error $\Delta f_o$. For this particular case, the local oscillator frequency is increased until $\Delta f_o = 0$, and at that point, $S'(t) = S(t)$. For cases where the slope is nonlinear, the response time of the loop will determine how accurately the signal S(t) is replicated by S'(t).

While several embodiments and variations of the present invention for a tracking receiver for broadband chirp emissions are described in detail herein, it should be apparent that the disclosure and teachings of the present invention will suggest many alternative designs to those skilled in the art.

What is claimed is:

1. A tracking receiver which utilizes optical processing for detecting and tracking an input broadband chirp like signal, comprising:
   a. a scanning local oscillator for producing a local oscillator output signal, which is caused to be scanned in frequency;
   b. a mixer for mixing the input signal and the local oscillator output signal to produce an intermediate frequency, frequency difference signal;
   c. an optical spectrum analyzer comprising an acousto-optical modulator for modulating a beam of radiation with the intermediate frequency, frequency difference signal, optical means for producing a spatial frequency distribution of the intermediate frequency spectrum in a fourier plane, and a photodetector means for detecting the spatial frequency distribution of the intermediate frequency spectrum in the Fourier plane;
   d. a processor means for processing the output of said photodetector means for a temporally stable grouped intensity pattern caused by an input spectra signal varying in frequency near the scan rate of the local oscillator, and being responsive thereto to control the frequency of the local oscillator to cause the frequency of the local oscillator to track the frequency of the input spectra signal.

2. A tracking receiver as claimed in claim 1, said photodetector means comprising a photodetector array positioned to detect radiation in said Fourier plane.

3. A tracking receiver as claimed in claim 1, including a recorder for recording the output of said scanning local oscillator.

4. A tracking receiver as claimed in claim 1, said processor means including means for controlling said scanning local oscillator to proceed through a programmed frequency scan pattern, and receiving initialization inputs of an initial search frequency, a programmed time rate of change of the frequency of the local oscillator, and a programmed slope or direction of change of the frequency of the local oscillator.

5. A tracking receiver as claimed in claim 1, including an intermediate frequency amplifier for amplifying said intermediate frequency, frequency difference signal.

6. A tracking receiver as claimed in claim 1, the input signal directed to said mixer comprising a radio frequency signal.

* * * * *